(12) United States Patent
Hsu et al.

(10) Patent No.: US 6,583,003 B1
(45) Date of Patent: Jun. 24, 2003

(54) METHOD OF FABRICATING 1T1R RESISTIVE MEMORY ARRAY

(75) Inventors: Sheng Teng Hsu, Camas, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/256,362

(22) Filed: Sep. 26, 2002

(51) Int. Cl.⁷ .......................................... H01L 21/8242
(52) U.S. Cl. ...................... 438/238; 438/382; 438/381
(58) Field of Search ................. 438/238–256, 438/381–399

(56) References Cited

U.S. PATENT DOCUMENTS 5,847,442 A * 12/1998 Mills et al. .................. 257/536
6,204,139 B1   3/2001 Liu et al. ..................... 438/385

OTHER PUBLICATIONS

Article entitled, "Electric–Pulse–Induced Reversible Resistance Change effect in Manetoresistive Films", by S. Q. Liu et al., published in Applied Physics Letters, vol. 76, No. 19, pp 2749–2751.

Article entitled, "Reproducible Switching Effect in Thin Oxide Films for Memory Applications", by A. Beck et al., published in Applied Physics Letters, vol. 77, No. 1, Jul. 3, 2000, pp 139–141.

* cited by examiner

Primary Examiner—Jey Tsai
(74) Attorney, Agent, or Firm—Matthew D. Rabdau; David C. Ripma; Scott C. Krieger

(57) ABSTRACT

A method is provided for forming a 1T1R resistive memory array. The method of forming a 1T1R resistive memory array structure on a semiconductor substrate comprises forming an array of transistors comprising a polycide/oxide/nitride gate stack with nitride sidewalls, the transistors comprising a source and a drain region adjacent to the gate stack. An insulating layer is deposited and planarized level with the polycide/oxide/nitride gate stack. Bit contact openings are etched to expose the drain region. Bottom electrodes are formed by depositing and planarizing a metal. A resistive memory material is deposited over the bottom electrodes. Top electrodes are formed over the resistive memory material. The 1T1R resistive memory array may be connected to support circuits that are formed on the same substrate as the memory array. The support circuits may share many of the process steps with the formation of the transistors for the memory array.

25 Claims, 4 Drawing Sheets

METHOD OF FABRICATING 1T1R RESISTIVE MEMORY ARRAY

BACKGROUND OF THE INVENTION

The present invention relates to information storage devices, and more specifically to a memory cell array incorporating a resistive memory element.

New materials are now making it possible to produce non-volatile memory cells based on a change in resistance. Materials having a perovskite structure, among them colossal magnetoresistance (CMR) materials and high temperature superconductivity (HTSC) materials are materials that have electrical resistance characteristics that can be changed by external influences.

For instance, the properties of materials having perovskite structures, especially for CMR and HTSC materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity from those used to induce the initial change.

SUMMARY OF THE INVENTION

A method of forming a 1T1R resistive memory array is provided. The method comprises forming an array of transistors on a substrate. The transistors may be formed using a process suitable for the formation of both the array of transistors as well as transistors used in at least some of the support circuits. Support circuits are defined here as any non-memory devices, which may be connected to the resistive memory array, such as coding, decoding, data processing or computing circuitry. The transistors comprise a polycide/oxide/nitride gate stack with nitride sidewalls. A silicon oxide insulation layer is deposited and planarized, for example using CMP, to the level of the gate stack. Photoresist is used to form a bit contact pattern. Bit contact openings are then opened to expose the drain regions of the transistors. A metal, such as Pt or Ir, is then deposited and planarized to the level of the gate stack to form bottom electrodes. A layer of resistive memory material is then deposited over the bottom electrodes, and possibly over the entire array of transistors. Top electrodes are then formed over the resistive memory material.

Using the present method, it may be possible to form a resistive memory array without adding a significant number of additional steps, as the process steps associated with the formation of support circuits can be used to form the array of transistors that form the resistive memory array.

DETAILED DESCRIPTION OF THE INVENTION

Figure 1:
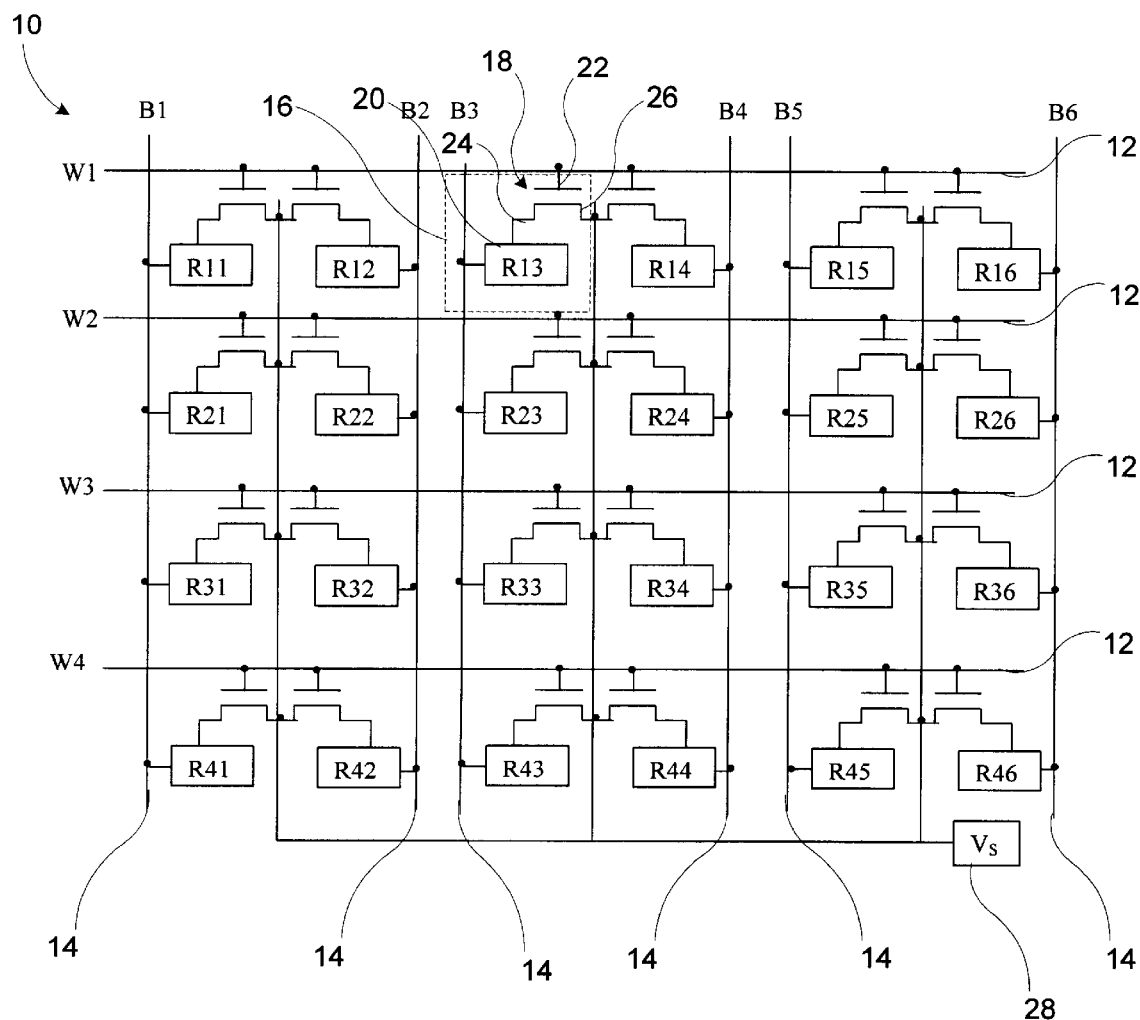
FIG. 1 is a schematic view of a resistive memory array.

FIG. 1 illustrates a schematic view of an embodiment of a 1T1R memory array 10. A 24 bit 1T1R memory array is shown. As shown, there are four word lines 12, labeled W1–W4, and six bit lines 14, labeled B1–B6. Each bit 16 (indicated by dashed lines) is formed by a transistor 18 and a resistive element 20, accordingly this memory element may be referred to as a 1-transistor, 1-resistor memory bit, or a 1T1R memory bit. Each transistor 18 has a gate 22, which is connected to one of the word lines 12. The resistive element 20 is connected between a drain 24 of a transistor 18 and a bit line 14. The transistor 18 has a source 26 connected to a common source 28 (designated Vs). As shown in this embodiment, the sources 26 of adjacent transistors 18 are connected together, which may reduce array area.

Figure 2:
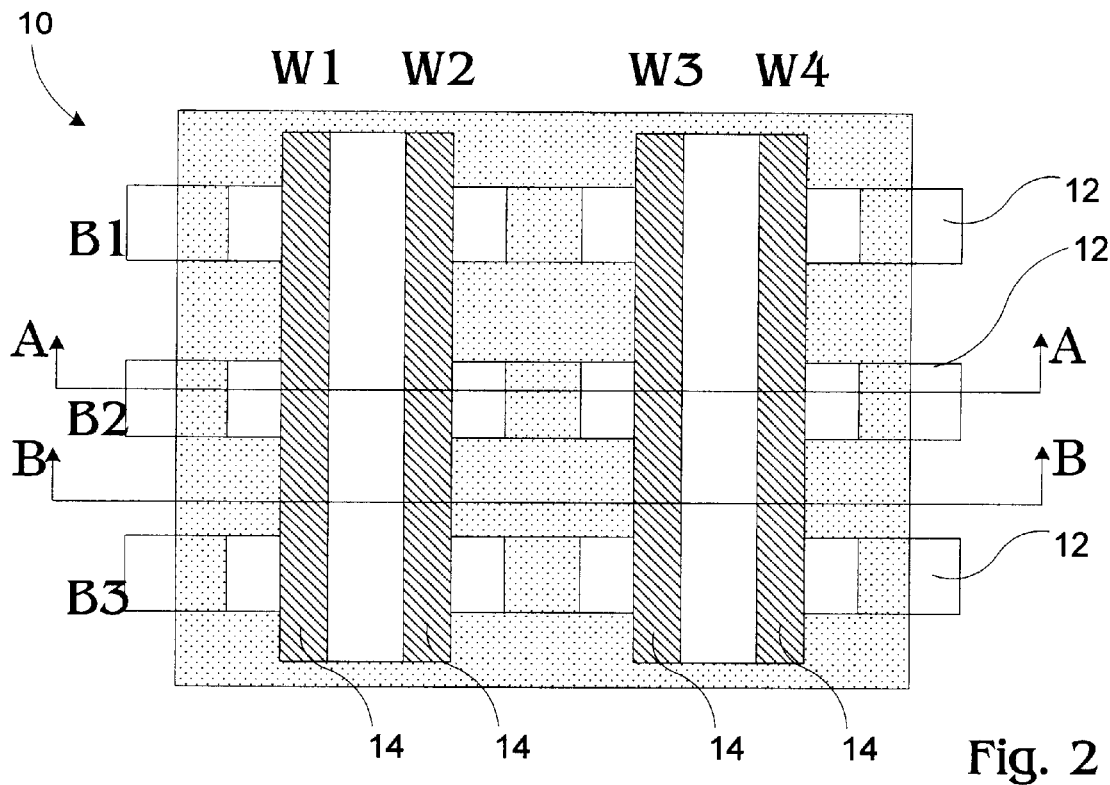
FIG. 2 is a planar view of a resistive memory array.

FIG. 2 illustrates a planar view of a 1T1R memory array 10 during processing. As shown in this embodiment, there are four word lines 12, labeled W1–W4, and three bit lines 14, labeled B1–B3, which form a 12 bit memory array.

Figure 3:
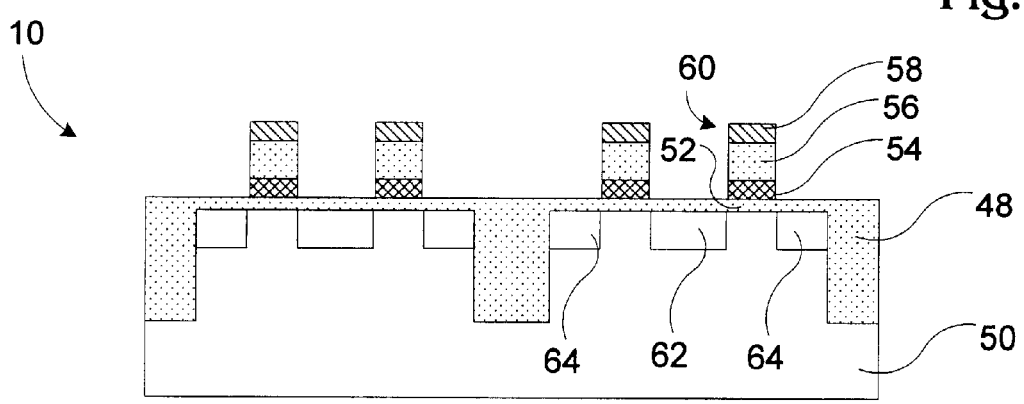
FIG. 3 is a cross-sectional view of the resistive memory array taken through a bit line.
Figure 4:
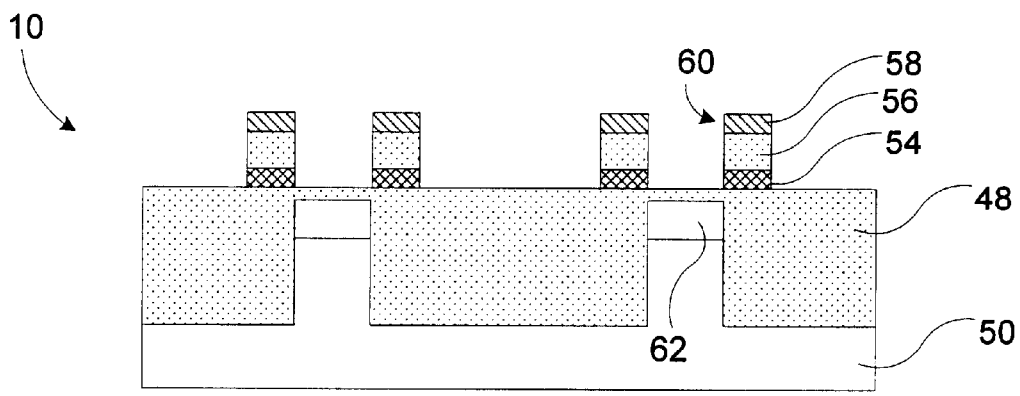
FIG. 4 is a cross-sectional view of the resistive memory array taken from between adjacent bit lines.

FIG. 3 shows a cross-section of the memory array of FIG. 2 taken through one of the bit lines 14, and corresponds to the cross-section identified as "A—A" in FIG. 2. FIG. 4 shows a cross-section that corresponds to "B—B" in FIG. 2, which is a cross-section taken between two adjacent bit lines 14. A standard process, which is well-known to those of ordinary skill in the art, may be used to form any desired wells and shallow trench isolation (STI) 48 on a substrate 50. A gate oxide 52 is grown over the substrate 50. A layer of polycide 54 is deposited, followed by a layer of oxide 56, and a layer of nitride 58. The term oxide as used herein refers to silicon oxide, including silicon dioxide. The term nitride refers generally to silicon nitride. For example, the polycide 54 may be between approximately 100 nm and 200 nm thick; the oxide 56 may be between approximately 100 nm and 200 nm thick, and the nitride between approximately 50 nm and 100 nm thick. Photoresist is deposited and patterned. The layers of polycide 54, oxide 56 and nitride 58 are then etched to form gate stacks 60, as shown in FIG. 3 and FIG. 4. Phosphorous or arsenic N+ source/drain ion implantation is then performed to produce source regions 62 and drain regions 64. The N+ ion implantation may include lightly-doped drain (LDD). The N+ ion implanation may include Halo ion implantation. Both of these implantation processes may be used in connection with support circuitry, if any, so that these processes performed in connection with the memory array need not add process steps to the total process.

Figure 5:
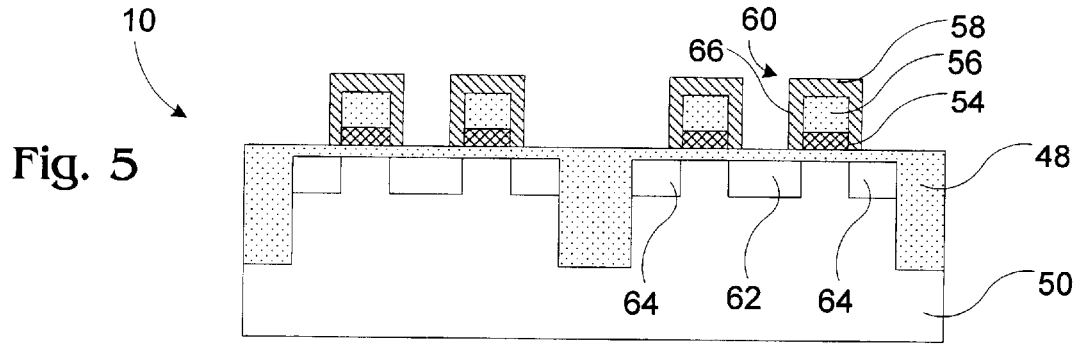
FIG. 5 is a cross-sectional view of the resistive memory array taken through a bit line.
Figure 6:
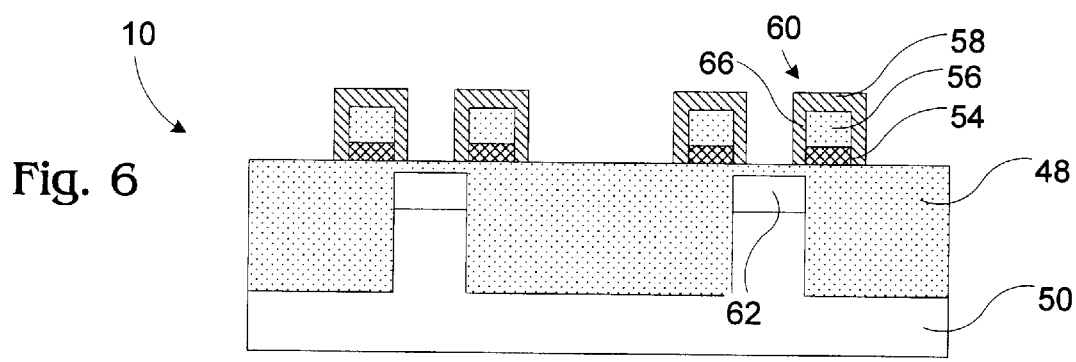
FIG. 6 is a cross-sectional view of the resistive memory array taken from between adjacent bit lines.

A layer of nitride is deposited, preferably to a thickness of between approximately 50 nm and 150 nm, and etched to form nitride sidewalls 66, as shown in FIGS. 5 and 6. FIG. 5 corresponds to FIG. 3 following formation of the nitride sidewalls 66. FIG. 6 corresponds to FIG. 4 following formation of the nitride sidewalls 66. A salicide process is then performed to salicide the N+ areas, which correspond to the source/drain regions 62 and 64, and the P+ areas, which within the memory array correspond to the p-well tie (not shown). The salicide proces may be used to form common source lines, for example between adjacent transistors. If the memory array is being formed simultaneously with support circuitry the P+ areas may also correspond to source/drain regions of some of the support circuitry (not shown).

Figure 7:
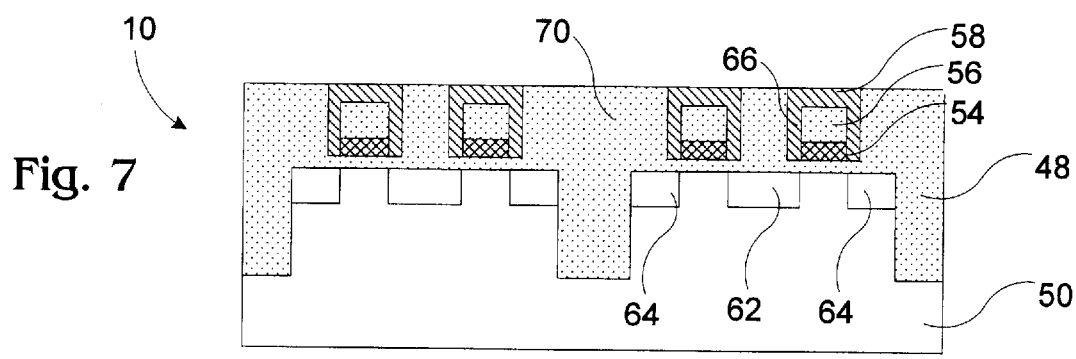
FIG. 7 is a cross-sectional view of the resistive memory array taken through a bit line.
Figure 8:
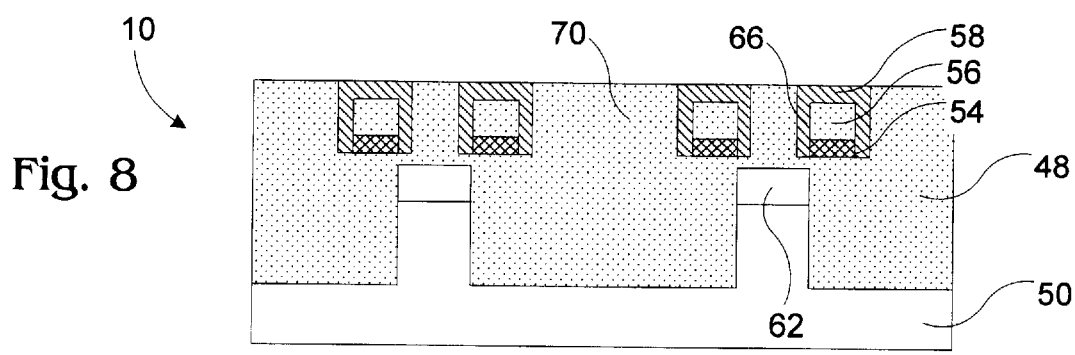
FIG. 8 is a cross-sectional view of the resistive memory array taken from between adjacent bit lines.

Silicon oxide 70 is deposited by a CVD process to a thickness suitable for planarization using a CMP process. For example, the silicon oxide may be deposited to a thickness of about 1.5 times the height of the gate stack 60. The silicon oxide 70 is then planarized using a CMP process. In one embodiment the planarization will be stopped at the nitride 58, resulting in the structure shown in FIG. 7, which corresponds to FIG. 5 following deposition and planarization of silicon oxide 70, and FIG. 8, which likewise corresponds to FIG. 6 following additional processing.

Figure 9:
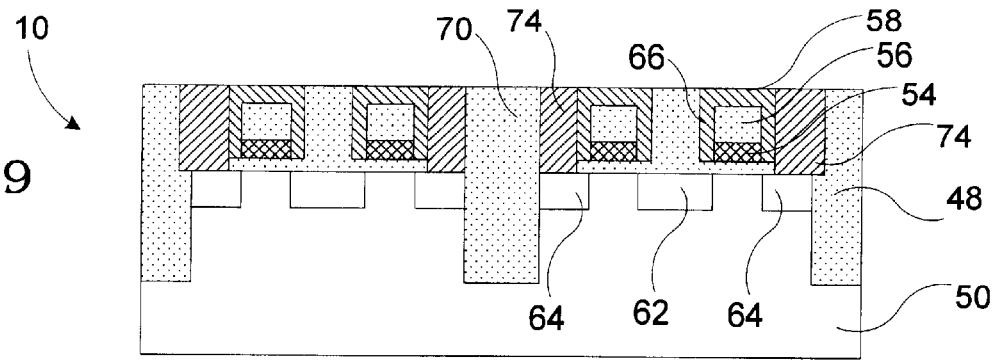
FIG. 9 is a cross-sectional view of the resistive memory array taken through a bit line.
Figure 10:
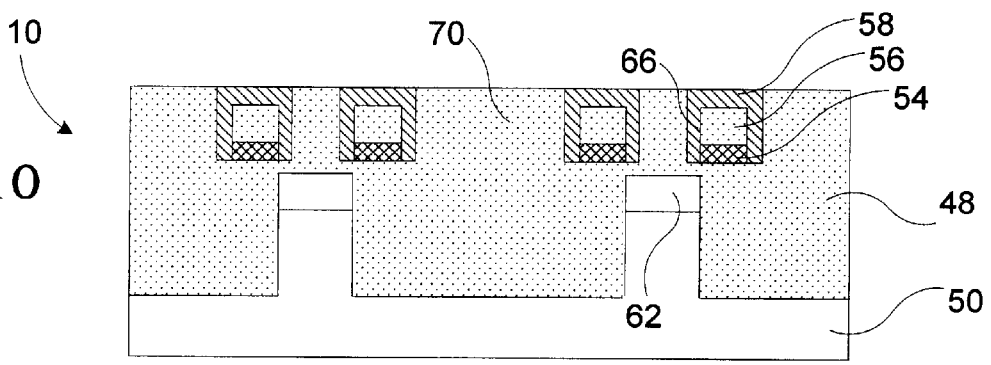
FIG. 10 is a cross-sectional view of the resistive memory array taken from between adjacent bit lines.

Photoresist is applied and patterned for bit contact etch. A selective etch of the oxide is used to open bit contacts. Because of the high selectivity of oxide to nitride etch, overlap of the mask pattern over the nitride 58 is tolerable. Due to the selectivity of the etch process the silicon oxide is etched without etching the nitride on top of the gate stack, this provides at least some self alignment of the bit contacts. A barrier metal, such as, TiN, TaN, TaAlN$_x$ is deposited to form a thin barrier layer (not shown). A bottom electrode material is then deposited. For example the bottom electrode material may be platinum or iridium. The bottom electrode material is planarized, for example using CMP, to the level of the nitride 58 to produce bottom electrodes 74. The resulting structure is shown in FIG. 9, which corresponds to the cross-section at the bit line, and FIG. 10, which corresponds to the cross-section between adjacent bit lines.

Figure 11:
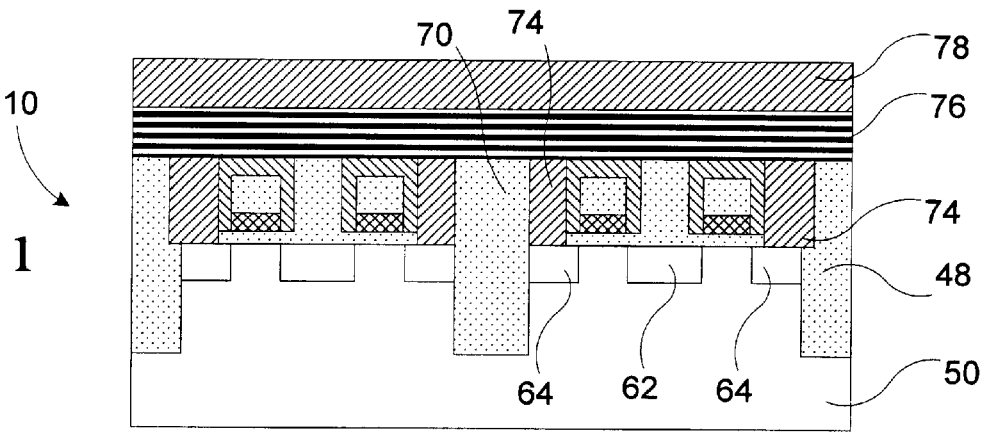
FIG. 11 is a cross-sectional view of the resistive memory array taken through a bit line.
Figure 12:
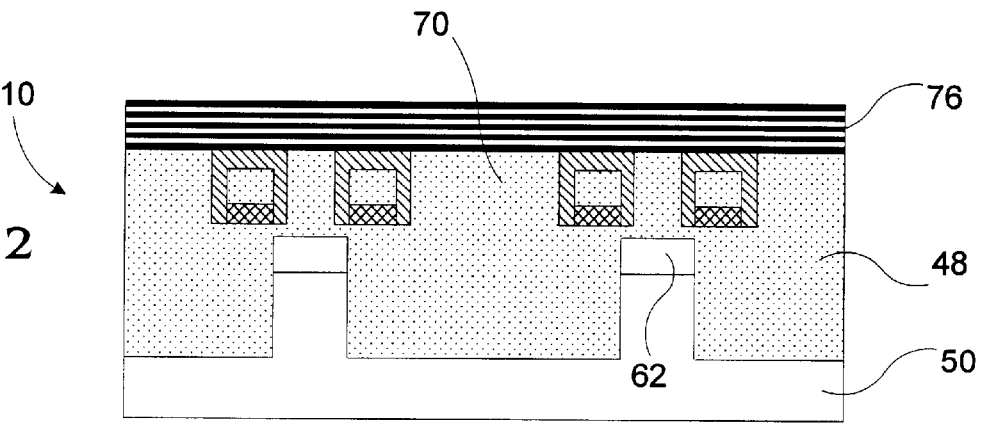
FIG. 12 is a cross-sectional view of the resistive memory array taken from between adjacent bit lines.

In one embodiment, a resistive memory material 76 is deposited over the bottom electrodes 74 across the memory array 10. Alternatively, the resistive memory material 76 is deposited over an entire wafer and removed from areas outside the memory array 10. The resistive memory material 76 is composed of any material that is capable of changing resistance in response to electrical pulses, for example a CMR and HTSC materials, such as PCMO. A top electrode 78 is then formed by depositing a top electrode material, such as platinum or iridium, patterning and etching the top electrode material to form one, or more, top electrodes 78, which correspond to the bit lines 14. The resulting memory array structure is illustrated by the cross-sectional view shown in FIG. 11, which corresponds to the cross section at a bit line, and FIG. 12, which corresponds to the cross section between adjacent bit lines.

In a second embodiment, a layer of resistive memory material 76 is deposited overlying the memory array and etched to form resistive memory studs (not shown) overlying the bottom electrodes 74. A thin layer of between approximately 10 and 50 nm of a barrier insulator, such as Si$_3$N$_4$, Al$_3$O$_5$ or TiO$_2$ is deposited, followed by a layer of oxide. The layer of oxide has a thickness suitable for CMP planarization, for example 1.5 times the height of the resistive memory studs. The layer of oxide is then planarized level with the resistive memory studs, possibly using CMP. The planarization process removes the barrier insulator from the tops of the resistive memory studs, prior to formation of the top electrodes 78.

In a third embodiment, resistive memory studs are formed using a single Damascene process. A layer of oxide is deposited to a thickness of between approximately 100 nm and 300 nm. Trenches are etched through the oxide to the bottom electrodes 74. A thin layer of barrier insulator, such as Si$_3$N$_4$, Al$_3$O$_5$ or TiO$_2$, between approximately 10 nm and 50 nm thick is deposited along the trenches, including on trench sidewalls. The barrier insulator is plasma etched to remove barrier insulator from planar surfaces, including the bottom electrodes 74, leaving barrier insulator on the trench sidewalls. The resistive memory material 76 is deposited and planarized to form resistive memory studs (not shown). Top electrodes 78 are then formed overlying the resistive memory studs.

Although the above embodiment, utilized an N+ ion implant for the formation of the source and drain regions, a P+ ion implant could have been used instead.

One process of forming transistors has been described in connection with the formation of the 1T1R resistive memory array. This process may be used to form support electronics as well as the memory array. For example, the support electronics and the memory array transistors may be formed using at least some of the process steps described above. An alternative process for forming transistors may be used, including for example a process that incorporates a high-k dielectric material. Once the transistors are formed, contact is made to the drain and a resistive memory material is deposited, as described above to form a 1T1R resistive memory array.

What is claimed is:

1. A method of forming a 1T1R resistive memory array structure on a semiconductor substrate comprising:
    a) forming a polycide/oxide/nitride gate stack overlying a gate dielectric on the semiconductor substrate;
    b) producing source and drain regions adjacent to the gate stack;
    c) performing a salicide process to form a silicide over the exposed source and drain regions;
    d) forming nitride sidewalls along the gate stack;
    e) depositing and planarizing a silicon oxide insulation layer level with the gate stack;
    f) patterning and etching bit contacts that connect to the drain regions;
    g) depositing and planarizing a bottom electrode;
    h) depositing a layer of resistive memory material; and
    i) forming top electrodes over the resistive memory material.

2. The method of claim 1, wherein forming a polycide/oxide/nitride gate stack comprises:
    a) depositing a polycide layer overlying the gate oxide;
    b) depositing a first silicon oxide layer overlying the polycide layer;
    c) depositing a nitride layer overlying the oxide layer;
    d) forming and patterning a photoresist mask for defining a gate stack area;
    e) etching the nitride layer, the oxide layer and the polycide layer outside the gate stack area to form a gate stack.

3. The method of claim 2, wherein depositing the polycide layer deposits polycide to a thickness between approximately 100 nm and 200 nm.

4. The method of claim 2, wherein depositing the first silicon oxide layer deposits silicon oxide to a thickness between approximately 100 nm and 200 nm.

5. The method of claim 2, wherein depositing the nitride layer deposits nitride to a thickness between approximately 50 nm and 100 nm.

6. The method of claim 1, wherein producing the source/drain regions comprises phosphorous or arsenic ion implantation.

7. The method of claim 6, wherein producing source/drain regions further comprises LDD and HALO implants.

8. The method of claim 1, wherein forming the nitride sidewalls comprises depositing 50 nm to 150 nm of nitride followed by etching.

9. The method of claim 1, wherein a barrier metal is deposited prior to depositing the bottom electrode.

10. The method of claim 1, wherein depositing and planarizing the bottom electrode produces bottom electrode a Pt or Ir bottom electrode.

11. The method of claim 1, wherein depositing a layer of resistive memory material deposits CMR or HTSC material.

12. The method of claim 11, wherein depositing a layer of resistive memory material deposits PCMO.

13. The method of claim 1, further comprises etching the resistive memory material to form resistive memory studs overlying the bottom electrodes, depositing and planarizing oxide level with the resistive memory studs, prior to forming top electrodes over the resistive memory studs.

14. The method of claim 13, further comprising depositing a barrier insulator layer of $Si_3N_4$, $Al_3O_5$ and $TiO_2$ prior to depositing oxide.

15. The method of claim 1, wherein depositing a layer of resistive memory material, comprises depositing a layer of oxide, etching trenches to open a contact to the bottom electrodes, depositing a barrier insulator of $Si_3N_4$, $Al_3O_5$ or $TiO_2$, and etching the barrier insulator to remove the barrier insulator from the bottom electrodes, depositing and planarizing the resistive memory material to form resistive memory studs.

16. The method of claim 1, wherein forming the top electrode forms a Pt, or Ir, top electrode.

17. A method of forming a 1T1R resistive memory array structure on a semiconductor substrate comprising:
   a) forming an array of transistors comprising a polycide/oxide/nitride gate stack with nitride sidewalls, the transistors comprising a source and a drain region adjacent to the gate stack;
   b) saliciding the source and drain regions;
   c) depositing and planarizing a silicon oxide layer level with the polycide/oxide/nitride gate stack;
   d) patterning photoresist to define bit contacts at least partially over at least one transistor drain;
   e) etching the silicon oxide layer to open a contact to the at least one transistor drain;
   f) depositing bottom electrode material and planarizing the bottom electrode material level with the polycide/oxide/nitride gate stack;
   g) depositing resistive memory material over the bottom electrode; and
   h) forming a top electrode over the resistive memory material.

18. The method of claim 17, further comprising forming support transistors simultaneously with forming the array of transistors.

19. The method of claim 18, further comprising forming electrical contacts between the array of transistors and the support transistors.

20. The method of claim 18, wherein depositing bottom electrode material deposits Pt.

21. The method of claim 18, wherein depositing resistive memory material deposits a CMR or HTSC material.

22. The method of claim 18, wherein depositing resistive memory material deposits PCMO.

23. The method of claim 17, further comprises etching the resistive memory material to form resistive memory studs overlying the bottom electrodes, depositing and planarizing oxide level with the resistive memory studs, prior to forming top electrodes over the resistive memory studs.

24. The method of claim 23, further comprising depositing a barrier insulator layer of $Si_3N_4$, $Al_3O_5$ and $TiO_2$ prior to depositing oxide.

25. The method of claim 17, wherein depositing a layer of resistive memory material, comprises depositing a layer of oxide, etching trenches to open a contact to the bottom electrodes, depositing a barrier insulator of $Si_3N_4$, $Al_3O_5$ or $TiO_2$, and etching the barrier insulator to remove the barrier insulator from the bottom electrodes, depositing and planarizing the resistive memory material to form resistive memory studs.

* * * * *